(12) United States Patent
Yang et al.

(10) Patent No.: US 9,183,950 B2
(45) Date of Patent: *Nov. 10, 2015

(54) MEMORY CARD

(71) Applicant: SAMSUNG ELECTRONICS CO., LTD., Suwon-Si, Gyeonggi-Do (KR)

(72) Inventors: Yun-Bo Yang, Asan-si (KR); Young-Jae Jung, Seoul (KR); Kui-Hyun Ro, Asan-si (KR); Sung-Eun Yun, Seoul (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/289,078

(22) Filed: May 28, 2014

(65) Prior Publication Data

US 2014/0281765 A1 Sep. 18, 2014

Related U.S. Application Data

(62) Division of application No. 13/227,004, filed on Sep. 7, 2011, now Pat. No. 8,769,353.

(30) Foreign Application Priority Data

Nov. 8, 2010 (KR) .................. 10-2010-0110304

(51) Int. Cl.
| | |
|---|---|
| *G11C 29/16* | (2006.01) |
| *G11C 29/48* | (2006.01) |
| *G11C 29/04* | (2006.01) |
| *G06F 11/27* | (2006.01) |
| *G11C 29/12* | (2006.01) |

(52) U.S. Cl.
CPC .............. *G11C 29/12* (2013.01); *G11C 29/16* (2013.01); *G11C 29/48* (2013.01); *G06F 11/27* (2013.01); *G11C 2029/0401* (2013.01)

(58) Field of Classification Search
CPC ........... G11C 2029/0409; G11C 29/08; G11C 29/12; G11C 29/16; G11C 29/48; G11C 2029/0401; G06F 11/0727; G06F 11/0748; G06F 11/0775; G06F 11/0787; G06F 12/0813; G06F 21/572
USPC .................. 714/718, 723, 733, 734, 763
See application file for complete search history.

(56) References Cited

U.S. PATENT DOCUMENTS

| | | |
|---|---|---|
| 5,668,815 A | 9/1997 | Gittinger et al. |
| 5,995,731 A | 11/1999 | Crouch et al. |
| 6,182,257 B1 | 1/2001 | Gillingham |

(Continued)

*Primary Examiner* — James C Kerveros
(74) *Attorney, Agent, or Firm* — F. Chau & Associates, LLC

(57) ABSTRACT

A memory card includes a memory cell, a connector, a controller, and firmware. The memory cell can switch between a plurality of states. The connector can be connected to an external device and exchange signals including commands and data with the external device. The controller exchanges signals with the connector, analyzes a received signal, and accesses the memory cell to record, retrieve or modify data based on the analysis result. The firmware is located within the controller, controls the operation of the controller, and can be set to a test mode or a user mode. When the firmware receives a test command from the external device and the firmware is set to the test mode, the firmware performs a defect test on the memory cell and transmits the result of the defect test to the external device through the connector.

4 Claims, 4 Drawing Sheets

(56) References Cited

U.S. PATENT DOCUMENTS

| | | |
|---|---|---|
| 6,567,017 B2 | 5/2003 | Medlock et al. |
| 6,829,728 B2 | 12/2004 | Cheng et al. |
| 6,941,499 B1 | 9/2005 | Sung et al. |
| 6,959,256 B2 | 10/2005 | Basto |
| 6,981,188 B2 | 12/2005 | Galzur et al. |
| 7,053,470 B1 | 5/2006 | Sellers et al. |
| 7,308,623 B2 | 12/2007 | Slobodnik et al. |
| 7,356,741 B2 | 4/2008 | Boehler |
| 7,383,478 B1 | 6/2008 | Ballagh et al. |
| 7,424,660 B2 | 9/2008 | Kebichi et al. |
| 7,653,846 B2 * | 1/2010 | Kim et al. ............ 714/718 |
| 7,676,709 B2 | 3/2010 | Chan |
| 7,681,094 B2 * | 3/2010 | Guterman et al. ........ 714/718 |
| 7,814,377 B2 * | 10/2010 | Stolero et al. ........ 714/718 |
| 8,006,144 B2 | 8/2011 | Hughes |
| 8,095,851 B2 * | 1/2012 | Diggs et al. ........ 714/763 |
| 8,145,958 B2 | 3/2012 | Aitken et al. |
| 8,484,521 B2 * | 7/2013 | Carman et al. ........ 714/723 |
| 2009/0063916 A1 | 3/2009 | Vogelsang |
| 2010/0332943 A1 * | 12/2010 | D'Abreu et al. ........ 714/763 |

\* cited by examiner

MEMORY CARD

CROSS-REFERENCE TO RELATED APPLICATIONS

This application is a divisional application of U.S. application Ser. No. 13/227,004 filed Sep. 7, 2011, now U.S. Pat. No. 8,769,353, which claims priority to Korean Patent Application No. 10-2010-0110304 filed on Nov. 8, 2010 in the Korean Intellectual Property Office, the disclosures of which are each incorporated by reference herein in their entireties.

BACKGROUND

1. Technical Field

Embodiments of the present inventive concept relate to a memory card, and more particularly, to a memory card having a built-in self-test (BIST) function.

2. Discussion of Related Art

Due to advancements in the communication industry, large-capacity memory cards such as moviNAND are being made available to the general public. The moviNAND is an embedded NAND flash memory that uses a Secure Digital (SD)/MultiMediaCard (MMC) interface protocol. Large-capacity memory, such as a moviNAND, may include defects due to its high integration density. Therefore, the entire region of the large-capacity memory may need to be tested to determine whether the memory is defective before the memory is shipped.

A device can be tested using a built-in self-test (BIST) circuit. The BIST circuit includes a test vector that can test the device and a circuit that compares output values of the device. The BIST circuit identifies whether a desired value is output from the device when the test vector is input to the device as a test and outputs information about whether the device has passed or failed the test. A testing method that makes use of a BIST circuit uses a small number of pins and may reduce testing costs. The BIST circuit may be used to test logic circuits or memory cards.

As compared to a small-capacity memory card, a large-capacity memory card may require a larger testing time, which can lead to increased test equipment investment costs and test processing times.

SUMMARY

At least one embodiment of the inventive concept provides a memory card capable of performing a built-in self-test (BIST) without requiring modifications to an internal design thereof.

At least one embodiment of the inventive concept provides a memory card in which BIST firmware is inserted into an embedded controller thereof. Thus, the memory card can test itself even if it is disconnected from an external device during the test.

According to an exemplary embodiment of the inventive concept, a memory card includes a memory cell, a connector, a controller, and firmware. Data can be read from, written to, or deleted from the memory cell. The memory cell can switch between a plurality of states. The connector can be connected to an external device and exchange signals including commands and data with the external device. The controller exchanges signals with the connector, analyzes a received signal, and accesses the memory cell to record, retrieve or modify data based on the analysis result. The firmware is located within the controller. The firmware may be located within a memory region of the controller. The firmware controls the operation of the controller, and can be set to a test mode or a user mode. When a test command is received by the firmware from the external device and the firmware is set to the test mode, the firmware performs a defect test on the memory cell and transmits the result of the defect test to the external device through the connector.

According to an exemplary embodiment of the inventive concept, a memory card includes a memory cell, a connector, a controller, firmware, and a power supply. Data can be read from, written to, or deleted from the memory cell. The memory cell can switch between a plurality of states. The connector can be connected to an external device and exchange signals including commands and data with the external device. The controller exchanges signals with the connector, analyzes a received signal, and accesses the memory cell to record, retrieve or modify data based on the analysis result. The firmware is located within the controller. The firmware may be located within a memory region of the controller. The controller controls the operation of the controller, and can be set to a test mode or a user mode. The power supply enables the firmware to maintain the test mode. When the firmware receives a test command once from the external device as a single signal when the firmware is set to the test mode, the firmware performs a defect test on the memory cell. During the test, the connector may be disconnected from the external device. However, power is still supplied from the power supply to the memory card even when the connector is disconnected. After the defect test, the firmware transmits the result of the defect test to the external device through the connector.

According to an exemplary embodiment of the inventive concept, a memory card includes a memory cell, a connector, a controller, firmware, and a power supply. Data can be read from, written to, or deleted from the memory cell. The memory cell can switch between a plurality of states. The connector can be connected to an external device and exchange signals including commands and data with the external device. The controller exchanges signals with the connector, analyzes a received signal, and accesses the memory cell to record, retrieve or modify data based on the analysis result. The firmware is located within the controller. The firmware may be located within a memory region of the controller. The firmware controls the operation of the controller, and can be set to a test mode or a user mode. The power supply enables the firmware to maintain the test mode. The states include one or more of a transmission state, a data transmission state, a data reception state, a bus test state, an idle state, a standby state, a disconnected state and a programming state. The firmware performs a defect test on the memory cell. During the test, the connector may be disconnected from the external device. However, power is still supplied from the power supply to the memory card even when the connector is disconnected. The defect test may be performed when a test command is received once from the external device as a single signal and the firmware is set to the test mode. After the defect test, the firmware transmits the result of the defect test to the external device through the connector. The firmware performs the defect test by repeatedly switching the memory cell from one of the states to another. The external device switches the firmware to the user mode by recording drive firmware data of the memory card in the memory region of the firmware and switches the firmware to the test mode by recording test firmware data of the memory card in the memory region of the firmware.

According to an exemplary embodiment of the inventive concept, a memory card includes a wireless communication module, a controller, firmware, and a memory cell. The wireless communication module wirelessly exchanges signals including commands and data with the external device. The controller exchanges signals with the module, analyzes a received signal, and accesses the memory cell to record, retrieve or modify data based on a result of the analysis. The firmware is located within the controller. The firmware controls an operation of the controller. The firmware is configured to be set to a test mode or a user mode. When the firmware receives a test command from the external device via the module and the firmware is set to the test mode, the firmware performs a defect test on the memory cell and transmits a result of the defect test to the external device via the wireless communication module.

According to an exemplary embodiment of the inventive concept, a method of configuring a memory card includes connecting an external device to the memory card, the device sending a test command to a controller of the memory card to set firmware within the controller to a test mode, the firmware performing a test on a memory cell within the memory card in response to the test command, the firmware transmitting a result of the test to the external device, and the external device sending an operating command to the controller to set the firmware to a user mode only when the result indicates the memory cell is free of defects. The method may further include the controller of the memory card determining whether a connection between a connector of the memory card and the external device has been terminated and a power supply of the memory card maintaining a continuous supply of power to the firmware if the connection has been terminated while the test is being performed.

According to an exemplary embodiment of the inventive concept, a memory card includes a memory cell, a wireless communication module which wirelessly exchanges signals including commands and data with an external device, a controller configured to exchange signals with the module, analyze a received signal, and access the memory cell to record, retrieve or modify data based on a result of the analysis, and firmware located within the controller. The firmware controls an operation of the controller and the firmware is configured to be set to a test mode or a user mode. When the firmware receives a test command from the external device via the module and the firmware is set to the test mode, the firmware performs a defect test on the memory cell and transmits a result of the defect test to the external device via the wireless communication module.

BRIEF DESCRIPTION OF THE DRAWINGS

The present inventive concept will become more apparent by describing in detail exemplary embodiments thereof with reference to the attached drawings, in which.

DETAILED DESCRIPTION

The present inventive concept will now be described more fully hereinafter with reference to the accompanying drawings, in which exemplary embodiments of the inventive concept are shown. The inventive concept may, however, be embodied in different forms and should not be construed as limited to the exemplary embodiments set forth herein. The same reference numbers indicate the same components throughout the specification. In the attached figures, the thickness of layers and regions may be exaggerated for clarity. It will also be understood that when a layer is referred to as being "on" another layer or substrate, it can be directly on the other layer or substrate, or intervening layers may also be present.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Hereinafter, a memory card according to at least one exemplary embodiment of the present inventive concept will be described with reference to the attached drawings.

Figure 1:
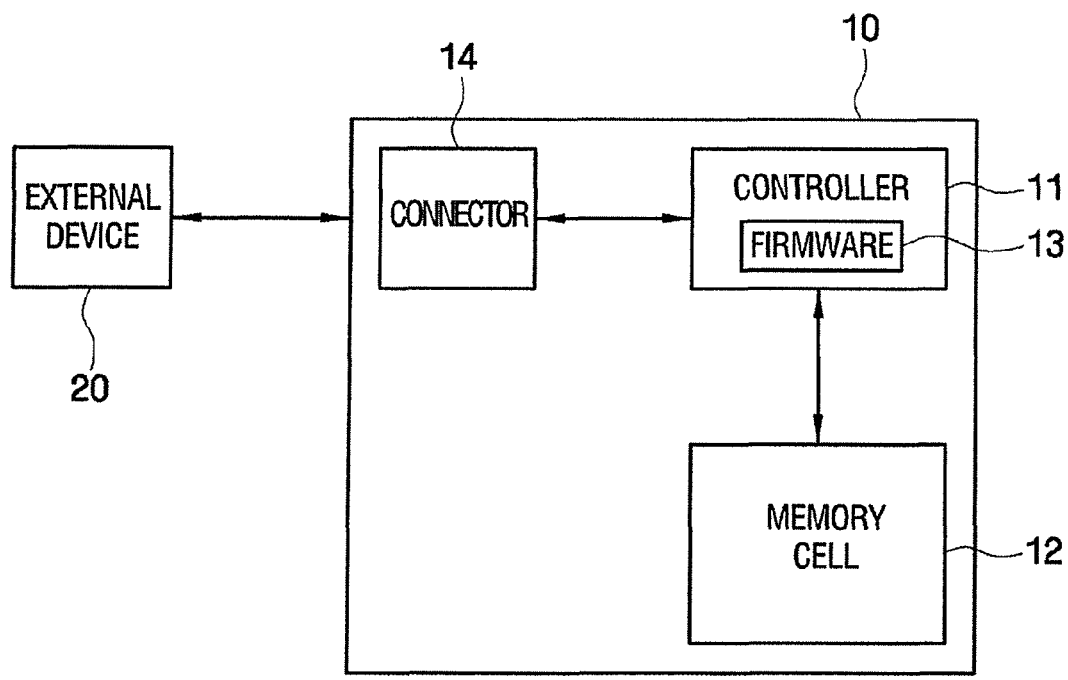
FIG. 1 illustrates a schematic configuration of a memory card according to an exemplary embodiment of the present inventive concept.
Figure 2:
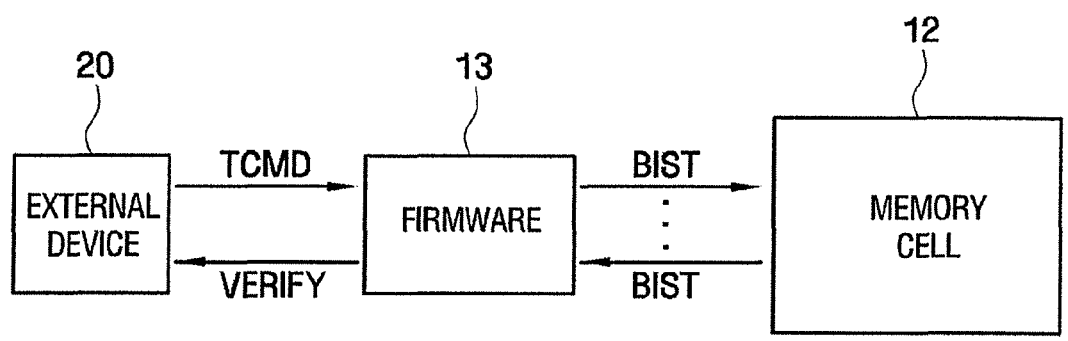
FIG. 2 schematically illustrates a built-in self-test (BIST) process of the memory card shown in FIG. 1 according to an exemplary embodiment of the present inventive concept.
Figure 3:
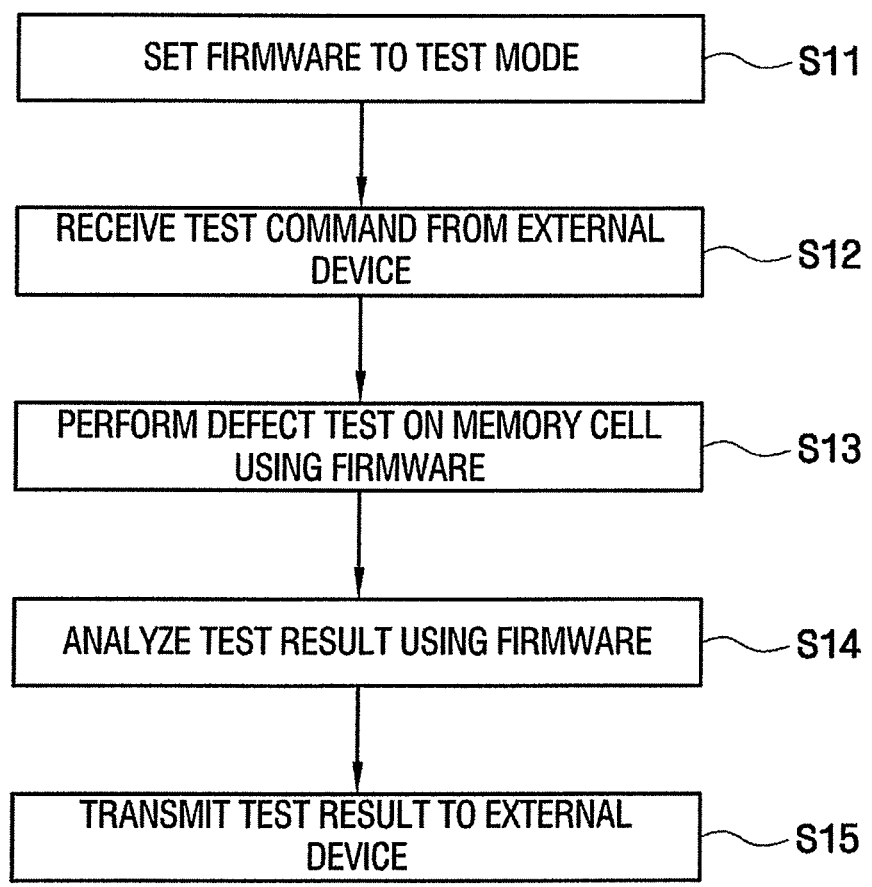
FIG. 3 is a flowchart illustrating the BIST process of FIG. 2 according to an exemplary embodiment of the present inventive concept.
Figure 4:
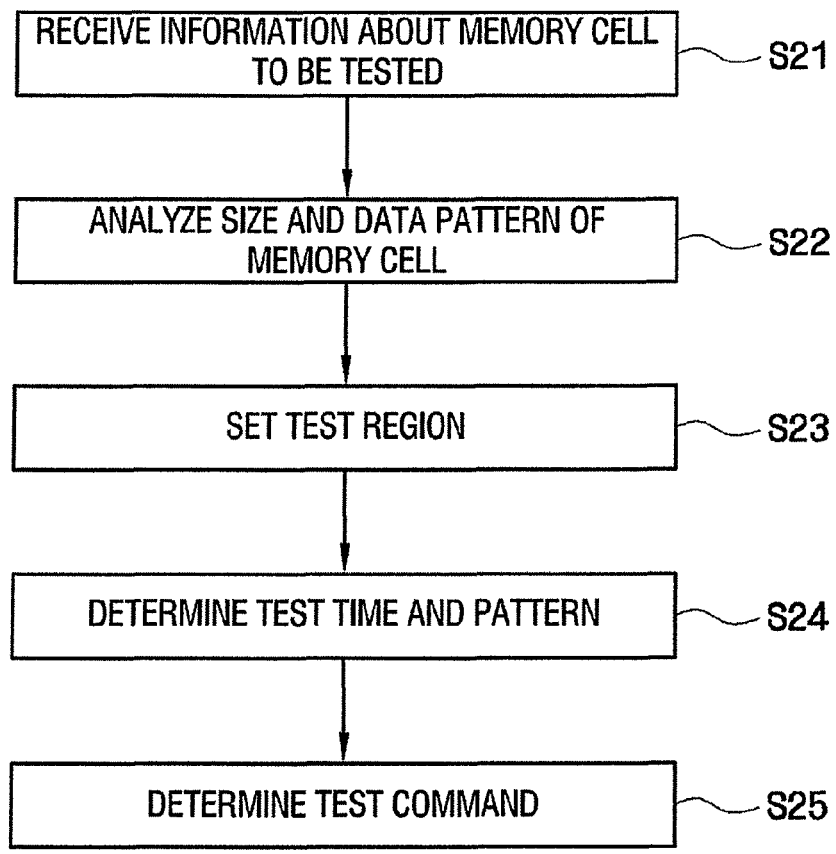
FIG. 4 is a flowchart illustrating a process of determining a test command in the BIST process of FIG. 3 according to an exemplary embodiment of the present inventive concept.

FIG. 1 illustrates the schematic configuration of a memory card 10 according to an exemplary embodiment of the present inventive concept. FIG. 2 schematically illustrates a built-in self-test (BIST) process of the memory card 10 shown in FIG. 1 according to an exemplary embodiment of the inventive concept. FIG. 3 is a flowchart illustrating the BIST process of FIG. 2 according to an exemplary embodiment of the inventive concept. FIG. 4 is a flowchart illustrating a process of determining a test command in the BIST process of FIG. 3 according to an exemplary embodiment of the inventive concept.

Referring to FIG. 1, the memory card 10 includes a memory cell 12, a controller 11, and a connector 14. Data can be read from, written to, or deleted from the memory cell 12 and the memory cell can switch between a plurality of states. The connector 14 can be used to connect the memory card 10 to an external device 20 and exchange signals including commands and data with the external device 20. The controller 11 can exchange signals with the connector 14. The controller 11 can analyze a signal received across the connector 14 to access the memory cell 12 to record, retrieve or modify data based on the analysis result. The controller includes firmware 13, which may be located within a memory region of the controller. The firmware 13 controls the operation of the controller 11 and can be set to a test mode or a user mode. When a test command is received from the external device 20 when the firmware 13 is set to the test mode, the firmware 13 performs a defect test on the memory cell 12 and transmits the result of the defect test to the external device 20 through the connector 14.

The connector 14 may be directly connected to the external device 20 and serves as an input/output passage for data and commands. The connector 14 may be a connection terminal made of a metal material. The connector 14 may directly contact a port of the external device 20 to transmit or receive a signal and/or data including a command. In an alternate embodiment, the connector 14 may be replaced with a wireless communication module. As an example, the wireless communication module can transmit or receive data and commands using a short-range wireless communication protocol or a wireless network. In at least one embodiment, the wireless communication module is a near field communication (NFC) device. NFC is a set of short-range wireless technologies, typically requiring a distance of 4 cm or less. The wireless communication module may be an unexposed, embedded module of the memory card 10.

The controller 11 is embedded in the memory card 10 and controls the connector 14 (or the wireless communication module) and the memory cell 12. As compared to a controller that is separate from a memory card, an embedded controller used to control memory access may allow data to be recorded, retrieved, modified or deleted from memory spaces more rapidly. The controller 11 controls the process of recording external data or commands received through the connector 14 (or the wireless communication module) in the memory cell 12. Also, the controller 11 controls the process of retrieving, modifying or deleting data recorded in the memory cell 12. Accordingly, the controller 11 may improve the performance of the memory card 10.

A firmware region (e.g., the firmware 13) is formed within the controller 11. The firmware 13 may be a core region of the controller 11. The firmware 13 controls the controller 11 and serves as a platform that facilitates the operation of the controller 11. As will be described later, the firmware 13 according to the at least one exemplary embodiment of the inventive concept may be set to the user mode when the memory card 10 is used to store and carry data. The firmware 13 may be set to the test mode to perform a defect test on the memory card 10 just before the memory card 10 is shipped as a complete product. The firmware 13 being set to the test mode will be described in greater detail below.

The memory cell 12 is a region in which data may read from, written to, or deleted from. The memory cell 12 may be a collection of a plurality of unit memory cells. The capacity and type of the memory card 10 may be determined by the memory cell 12. The memory cell 12 may store data input from an external source, for example, multimedia files (such as way, mp3, tiff and avi) and text files (such as txt, doc and hwp). In response to a query command from the external device 20, the memory cell 12 may transmit a stored file to the external device 20 or transmit query results to the external device 20. In addition, regions of the memory cell 12 can be freely recorded and erased. Therefore, different data values can be input to the same address by repeating a record operation a plurality of times. The external device 20 may be a digital device in which the memory card 10 according to an exemplary embodiment of the inventive concept is used. Examples of the digital device include a personal computer (PC), a digital camera, an mp3 player, a camcorder, etc. For example, the memory card 10 may be connected to a digital device such as those mentioned above and exchange data and signals with the digital device, thereby increasing the scalability of the digital device.

To retrieve, record, or delete data, the memory cell 12 may need to switch from one of a plurality of states to another state. For example, when no external command is input, the memory cell 12 may remain in an idle state or a standby state. When a query command is received from the external device 20 (e.g., the digital device), the memory cell 12 retrieves data based on query conditions included in the query command. Then, the memory cell 12 switches to a data transmission state and transmits the retrieved data to the external device 20. The states of the memory cell 12 may include one or more of a transmission state, a data transmission state, a data reception state, a bus test state, an idle state, a standby state, a disconnected state, and a programming state. As will be described below, the firmware 13 may perform a defect test on the memory cell 12 by repeatedly switching the memory cell 12 from one of the states to another. The state changes of the memory cell 12 for a defect test according to exemplary embodiments of the present inventive concept will be described in detail below with reference to FIGS. 5 and 6.

The memory cell 12 in a controller-embedded large-capacity memory card (such as an embedded MultiMediaCard (eMMC) or a moviNAND memory) is highly integrated. Since large-capacity memories may have more defects than small-capacity memories, the memory cell 12 may need to be tested for errors or defects. While various testing methods can be used, in an exemplary embodiment of the inventive concept, a BIST method is used. The BIST method allows a test region embedded in a device to be used to test the device. Thus, test results can be obtained rapidly without the need to modify the device.

Referring to FIGS. 2 and 3, the memory card 10 according to an exemplary embodiment of the inventive concept includes the firmware region (e.g., the firmware 13) within the controller 11, as described above. The firmware 13 may be set to one of the user mode and the test mode by the external device 20.

When the firmware 13 is set to the test mode, the external device 20 may serve as a test hosting device for the testing of the memory card 10. The test hosting device transmits a test command to the memory card 10 so that the memory card 10 performs a BIST. The test hosting device may be installed on a production line as part of an inline process for memory production. The test hosting receives the test result from the memory card 10 and determines whether to ship the memory card 10 based on the received test result. Alternately, when the firmware 13 is set to the user mode, the external device 20 may be one of the digital devices described above.

The memory card 10 can be shipped as a finished product after a memory test process determines that the memory card 10 is not defective.

The external device 20 connected to the memory card 10 according to an exemplary embodiment of the inventive concept records test firmware data, which is used to test the memory card 10, in the memory region of the firmware 13 within the controller 11, thereby switching the firmware 13 to the test mode (operation S11). The test firmware data includes an algorithm for testing the memory card 10. The test firmware data may vary according to a memory type of the memory cell 12 and/or a controller type of the controller 11. When the algorithm is executed in response to a test command from the external device 20, the BIST may be implemented.

The BIST begins when the external device 20 (e.g., the test hosting device) transmits a test command TCMD to the firmware 13, which is set to the test mode (operation S12). The test command TCMD may be received once from the external device 20 as a single signal. The memory card 10 according to an exemplary embodiment of the inventive concept may be disconnected from the external device 20 after receiving the test command TCMD, which is used for the memory test. In the memory card 10 according to an exemplary embodiment of the inventive concept, the test firmware data including the algorithm for testing the memory card 10 is recorded in the memory region of the firmware 13 within the embedded controller 11. In addition, the received test command TCMD may include information such as the test region, test time, and test pattern of the memory card 10. Therefore, even when the memory card 10 is disconnected from the external device 20, the firmware 13 can repeatedly perform read and write tests by changing the state of the memory cell 12 and determine whether the memory card 10 is defective (operation S13).

After transmitting the test command TCMD, the external device 20 can be connected to another memory card and transmit the test command TCMD to the memory card while the memory card 10 performs the BIST. Alternately, instead of the external device 20 transmitting the test command TCMD to another memory card, resources of the external device 20 can be applied to another job while the memory card 10 performs the BIST. For example, while the memory card 10 performs the BIST, the connector 14 of the memory card 10 may be disconnected from the external device 20 after receiving the test command TCMD. Power may be supplied to the memory card 10 to enable the firmware 13 to maintain the test mode regardless of whether the connector 14 is connected to the external device 20. In at least one embodiment, while the memory card 10 is tested, it does not exchange signals or data with the external device 20. However, even though the memory card does not exchange signals or data with the external device, in at least one embodiment, power is continuously supplied to the memory card 10 to enable the firmware 13 to continue its test. In at least one embodiment, a power supply is provided to supply power that enables the memory card 10 including the firmware 13 to continue its test.

The memory card 10 according to at least one exemplary embodiment can perform the BIST as long as power is supplied thereto. Since the external device 20 does not need to be continuously connected to the memory card 10, it can successively perform defect tests on other memory cards within a short time. This may increase the number of tests performed per unit of time and improve test efficiency. Further, installation of additional test equipment for testing large-capacity memory cards may not be necessary.

After the termination of the BIST, the firmware 13 may analyze the result of the BIST (operation S14). In an alternate embodiment, the firmware 13 does not analyze the result of the BIST and transmits the result of the BIST to the external device 20 so that the external device 20 can analyze the result of the BIST. To transmit the BIST result of the memory card 10 to the external device 20, the connector 14 of the memory card 10 is connected to the external device 20 and transmits information about whether the memory cell 12 is defective to the external device 20 (operation S15). The result of the BIST may be transmitted once to the external device 20 as a single signal to minimize the connection time between the memory card 10 and the external device 20, thereby shortening the processing time. The information may be transmitted wirelessly to the external device 20 in an alternate embodiment where the connector 14 is replaced with the wireless communication module.

Referring to FIG. 4, the test command TCMD transmitted from the external device 20 (e.g., the test hosting device) to the memory card 10 is determined through a plurality of operations.

Information about the memory cell 12 to be tested is received from the memory card 10 (operation S21). If the same type of memory cards produced on successive production lines are to be tested, the above information may be received from a first memory card, and this operation may be omitted when subsequent memory cards are tested.

Information about the memory card 10 (such as the capacity, specification, and pattern of the memory card 10) is analyzed (operation S22). The information received from the memory card 10 (e.g., information about the capacity, specification, pattern or type of the memory card 10) is analyzed to test the entire region of the memory cell 12 of the memory card 10. In an alternate embodiment, only part of the memory cell 12 is sampled and tested.

A region of the memory cell 12, which is to be tested is set based on the analyzed information (operation S23), and a test time and a test pattern are determined (operation S24). When the entire region of the memory cell 12 is to be tested, it may be set as a test region, and the test time and the test pattern may be determined in view of the size of the memory cell 12. In an alternate embodiment, when some regions of the memory cell 12 are to be tested, they may be set as test regions, and the test time and the test pattern may be determined in view of the size of the selected test regions.

The test region(s) may include positions of a test start point and a test end point in the memory cell 12. The test pattern may include the sequence of a read test, a write test and a delete test performed by the firmware 13 and the state change of the memory cell 12 according to the order. For example, when the test pattern is set such that a read test of retrieving data from a memory region is conducted and then the data of the memory region is modified, the memory cell 12 may switch from the standby state to the transmission state and then to the data transmission state to transmit data to the external device 20. Then, the memory cell 12 may switch to the data reception state to receive data to be stored in a memory region and record the received data in the memory region. The test pattern may also include information about the sequence of state changes of the memory cell 12.

When the test conditions have been determined, the test command TCMD is determined based on the test conditions (operation 25). The test command TCMD may include information about the address, start point and end point of a memory region to be tested and information about the test time and the test pattern. The determined test command TCMD is transmitted from the external device 20 to the firmware 13 via the connector 14 (or the wireless communication module) of the memory card 10. Here, the external device 20 is a host device which instructs the firmware 13 to test the memory card 10 and appropriately process the memory card 10 based on the test result. The firmware 13 receiving the test command TCMD analyzes a protocol of the test command TCMD and extracts the test conditions included in the test command TCMD.

As described above, after receiving the test command TCMD, the memory card 10 according to an exemplary embodiment of the inventive concept operates independently of the external device 20, which requested the tests. For example, the test firmware data used to test the memory card 10 has already been recorded on the firmware 13, and the test command TCMD which determines test conditions has been input to the firmware 13. Therefore, even when the memory card 10 is disconnected from the external device 20, it can test itself. Further, in an embodiment of the inventive concept, the memory card requires power to continue performing the tests. The external device 20, which requests the tests, may transmit the test command TCMD to one memory card 10 and then may be disconnected from the memory card 10. Then, the external device 20 may be connected to another memory card and transmit the test command TCMD to that memory card. In this way, the external device 20 can test a plurality of memory cards 10 within a short time.

After the BIST of the memory card 10 is terminated, the memory card 10 may be connected to the external device 20 to transmit the result of the BIST to the external device 20, which requested the tests. As described above, the result of the BIST of the memory card 10 may be transmitted once to the external device 20 as a single signal. Then, the memory card 10 may be disconnected from the external device 20.

When the result of the BIST indicates that the memory card 10 is not defective, the external device 20 can switch the firmware 13 of the memory card 10 to the user mode so that the memory card 10 can be shipped as a finished product. For example, to allow the memory card 10 to be used in a digital device such as a PC, the external device 20 can switch the firmware 13 of the memory card 10 from the test mode to the user mode by recording firmware data for driving the memory card 10 in the memory region of the firmware 13. Since the firmware 13 can be switched between the test mode and the user mode by changing the data in the memory region of the firmware 13 without modifying the internal circuit of the memory card 10 (as a finished product) according to an exemplary embodiment of the inventive concept, the BIST can be performed with excellent efficiency.

Figure 5:
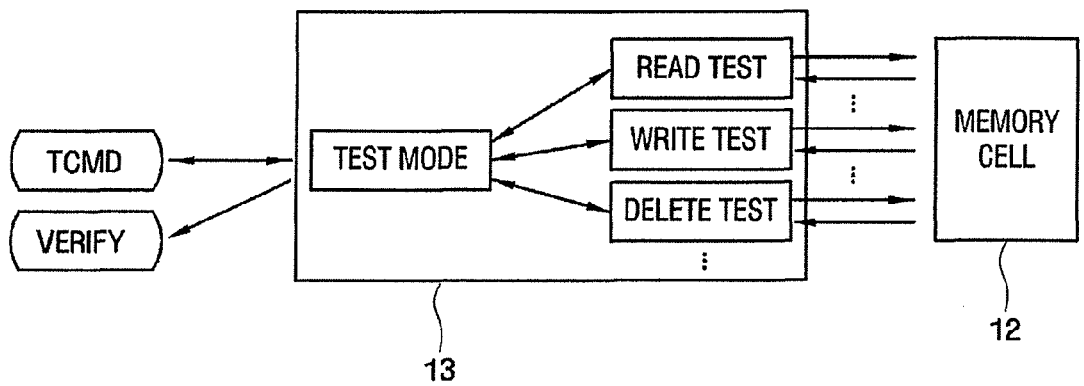
FIG. 5 schematically illustrates a BIST process of a memory card according to an exemplary embodiment of the present inventive concept.
Figure 6:
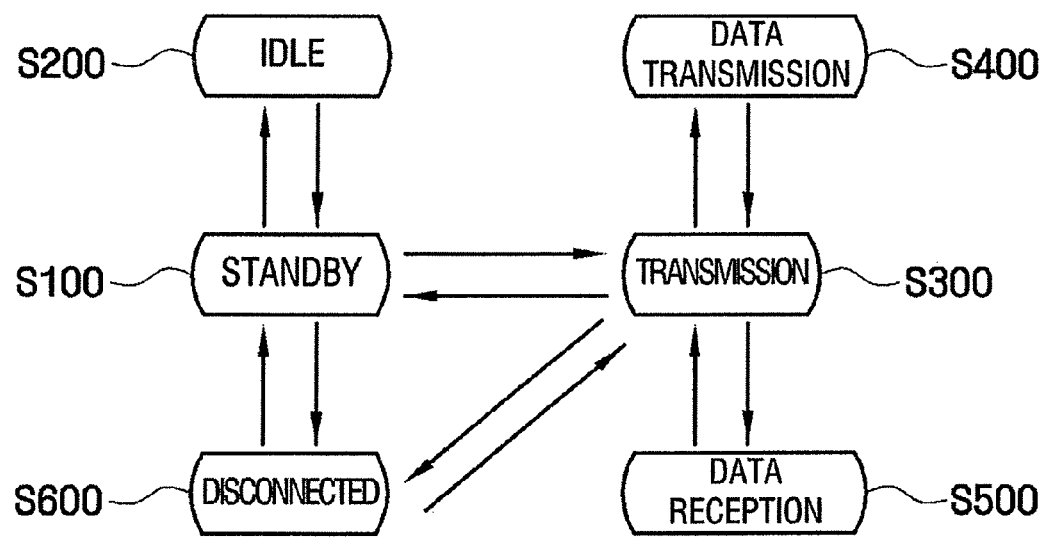
FIG. 6 illustrates state changes of a memory cell during the BIST process of FIG. 5 according to an exemplary embodiment of the present inventive concept.

Hereinafter, a memory card according to an exemplary embodiment of the present invention will be described with reference to FIGS. 5 and 6. FIG. 5 schematically illustrates a BIST process of a memory card according to an exemplary embodiment of the present inventive concept. FIG. 6 illustrates state changes of a memory cell during the BIST process of FIG. 5 according to an exemplary embodiment of the inventive concept.

A memory card according to an exemplary embodiment of the inventive concept includes a memory cell, a connector, a controller, and power supply. The controller includes firmware. Data can be written to, read from, or deleted from the memory cell. The memory cell is configured to switch between a plurality of states. The controller may store these states. The connector can be connected to an external device and exchange signals including commands and data with the external device. The controller exchanges signals with the connector, analyzes a received signal and accesses the memory cell to record, retrieve or modify data based on the analysis result. The firmware, which may be a memory region located within the controller, controls the operation of the controller and can be set to a test mode or a user mode. The power supply enables the firmware to maintain the test mode. When a test command is received from the external device when the firmware is set to the test mode, the firmware performs a defect test on the memory cell. The test command may be received only once as a single signal. During the defect test on the memory cell, the connector may be disconnected from the external device. However, even if the connector is disconnected, power is still supplied from the power supply to the memory card. After the defect test, the firmware transmits the result of the defect test to the external device through the connector. If the connector had been disconnected from the external device, the result can be transmitted to the external device upon re-connecting the connector to the external device. When the connector is replaced with a wireless communication module, the result can be sent upon a wireless connection being re-established.

Referring to FIG. 5, for a BIST of a memory card 10, a firmware 13 of the memory card 10 according to an exemplary embodiment of the inventive concept switches to the test mode and receives a test command TCMD from an external device 20. As described above in at least one of the previous exemplary embodiments, the test command TCMD may include various information and conditions for testing the memory card 10. Based on the test command TCMD, the firmware 13 conducts read, write, delete and modify tests.

In FIG. 6, the state changes of the memory cell 12 during a test are shown. When no command is received from the firmware 13, a memory cell 12 remains in a standby state S100 or an idle state S200, doing nothing. When the firmware 13 receives the test command TCMD from the external device 20, the state of the memory cell 12 may be changed to perform tests such as the read, write, delete and modify tests.

For the read test of the memory card 10, the firmware 13 switches the memory cell 12 to a transmission state S300 by transmitting a switch to transmission state command to the memory cell 12. Accordingly, data is retrieved from a requested memory region. Then, the firmware 13 switches the memory cell 12 to a data transmission state S400 by transmitting a switch to data transmission state command to the memory cell 12. After transmitting the data, the memory cell 12 switches to a disconnected state S600 to terminate the read test.

For the write test of the memory card 10, the firmware 13 switches the memory cell 12 to the transmission state S300 by transmitting the switch to transmission state command to the memory cell 12. Then, the firmware 13 switches the memory cell 12 to a data reception state S500 by transmitting a switch to data reception state command to the memory cell 12. When the memory cell 12 is in the data reception state S500, data to be recorded on the memory cell 12 is received. After the received data is recorded on the memory cell 12, the memory cell 12 switches to the disconnected state S600 to terminate the write test.

In this way, the firmware 13 according to an exemplary embodiment of the inventive concept performs a defect test by repeatedly switching the memory cell 12 from one of a plurality of states to another. Although the memory card 10 is disconnected from the external device 20 (i.e., the test hosting device) during the defect test, it can still test itself, and, after the test, only the test result is transmitted to the external device 20. Based on the test result indicating whether the memory card 10 is defective, it is determined whether to discard or ship the memory card 10.

The memory card 10 according to an exemplary embodiment of the inventive concept may further include a power supply (not shown), which enables the firmware 13 to maintain the test mode. The power supply may supply power needed to test the memory card 10 from outside the memory card 10. After the memory card 10 is tested, if it is determined that the memory card 10 is not defective, the firmware 13 switches to the user mode to terminate the test.

A memory card 10 according to at least one embodiment of the inventive concept is capable of performing a BIST without requiring modifications to its internal design. Since the BIST firmware 13 is located within or inserted into the embedded controller 11 of the memory card 10, the memory card 10 can test itself even if it is disconnected from the external device 20 during the test. Test efficiency may be increased and costs may be reduced when existing memory cards are replaced with the memory card 10.

Although the present inventive concept has been described in connection with exemplary embodiments thereof, those skilled in the art will appreciate that various modifications can be made to these embodiments without substantially departing from the principles of the disclosure.

What is claimed is:

1. A method of configuring a memory device, the method comprising:
   connecting, by a command/data connector of the memory device, an external device to the memory device;
   sending, by the external device, a test command to a controller of the memory device to set firmware within the controller to a test mode;
   performing, by the firmware, a test on a memory cell within the memory device in response to the test command;
   maintaining a continuous supply of power to the firmware regardless of whether the command/data connector is connected to the external device while the test is being performed;
   transmitting, by the firmware, a result of the test to the external device; and
   sending, by the external device, an operating command to the controller to set the firmware to a user mode only when the result indicates the memory cell is free of defects.

2. The method of claim 1, wherein the test includes reading data from the memory cell, writing data to the memory cell, and deleting data from the memory cell.

3. The method of claim 2, wherein the firmware switches the memory cell between at least two distinct states during the test.

4. The method of claim 1, further comprises:
   determining, by the controller, whether a connection between the command/data connector of the memory device and the external device has been terminated; and
   maintaining a continuous supply of power to the firmware if the connection has been terminated while the test is being performed.

* * * * *